(12) United States Patent
Sandhu et al.

(10) Patent No.: US 6,696,745 B2
(45) Date of Patent: *Feb. 24, 2004

(54) METHODS FOR USE IN FORMING A CAPACITOR AND STRUCTURES RESULTING FROM SAME

(75) Inventors: Gurtej S. Sandhu, Boise, ID (US); Garo Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/087,535

(22) Filed: Feb. 27, 2002

(65) Prior Publication Data

US 2003/0113975 A1 Jun. 19, 2003

Related U.S. Application Data

(62) Division of application No. 09/754,666, filed on Jan. 4, 2001, now Pat. No. 6,376,327, which is a continuation of application No. 08/918,634, filed on Aug. 22, 1997, now Pat. No. 6,200,874.

(51) Int. Cl.$^7$ ............................................ H01L 21/425
(52) U.S. Cl. ...................... 257/532; 257/306; 257/311; 257/650
(58) Field of Search ................... 257/532, 650, 257/641, 644, 295, 310, 306, 311

(56) References Cited

U.S. PATENT DOCUMENTS

| | | |
|---|---|---|
| 5,053,917 A | 10/1991 | Miyasaka et al. |
| 5,187,638 A | 2/1993 | Sandhu et al. |
| 5,270,241 A | 12/1993 | Dennison et al. |
| 5,335,138 A | 8/1994 | Sandhu et al. |
| 5,374,578 A | 12/1994 | Patel et al. |
| 5,381,302 A | 1/1995 | Sandhu et al. |
| 5,392,189 A | 2/1995 | Fazan et al. |
| 5,506,166 A | 4/1996 | Sandhu et al. |
| 5,506,748 A | 4/1996 | Hoshiba |
| 5,654,222 A | 8/1997 | Sandhu et al. |
| 5,773,314 A | 6/1998 | Jiang et al. |
| 5,804,509 A | 9/1998 | Cho |
| 5,838,035 A * | 11/1998 | Ramesh ............... 257/295 |
| 5,851,867 A | 12/1998 | Chen et al. |
| 5,869,406 A | 2/1999 | Su et al. |
| 5,886,867 A | 3/1999 | Chivukula et al. |
| 5,960,252 A | 9/1999 | Matsuki et al. |
| 6,124,626 A * | 9/2000 | Sandhu et al. .......... 257/532 |
| 6,200,874 B1 | 3/2001 | Sandhu et al. |

* cited by examiner

Primary Examiner—Tuan H. Nguyen
(74) Attorney, Agent, or Firm—Mueting, Raasch & Gebhardt, P.A.

(57) ABSTRACT

A method for use with the formation of a capacitor includes providing a capacitor structure by forming a first electrode on a portion of a substrate assembly, forming a high dielectric material over at least a portion of the first electrode, and forming a second electrode over the high dielectric material. An additional layer may be formed over at least a portion of the second electrode. The portion of the substrate assembly on which the first electrode is formed and/or the layer formed over the second electrode are formed of an excess oxygen containing material.

27 Claims, 2 Drawing Sheets

METHODS FOR USE IN FORMING A CAPACITOR AND STRUCTURES RESULTING FROM SAME

This is a division of application Ser. No. 09/754,666, filed Jan. 4, 2001, U.S. Pat. No. 6,376,327, which is a continuation of application Ser. No. 08/9 18,634, filed Aug. 22, 1997 (issued as U.S. Pat. No. 6,200,874 on Mar. 13, 2001) which are all incorporated herein by reference.

FIELD OF THE INVENTION

The present invention relates to fabrication of semiconductor devices. More particularly, the present invention relates to methods for forming capacitors with low leakage current.

BACKGROUND OF THE INVENTION

Capacitors are the basic energy storage devices in memory cells of memory devices such as random access memories (e.g., dynamic random access memory (DRAM) devices, static random access memory (SRAM) devices, and ferroelectric random access memory (FeRAM) devices. Generally, such capacitors consist of two conductive elements (e.g., metal or polysilicon plates), which act as the electrodes of the capacitor (i.e., the storage node electrode and the cell plate capacitor electrode). In the capacitors, the electrodes are insulated from each other by a dielectric material.

The ability to densely pack storage memory cells while maintaining required capacitance levels is a crucial requirement of semiconductor manufacturing technologies if future generations of expanded memory array devices are to be successfully manufactured. As memory devices increase in memory cell density, it is necessary to decrease the size of circuit components, such as capacitors. Thus, there is a continued challenge to maintain sufficiently high storage capacitance while decreasing cell area. It is desirable that each capacitor possesses as much capacitance as possible. Preferably, such capacitors should possess at least about $20 \times 10^{-15}$ farads/cell, and more preferably at least about $60 \times 10^{-15}$ farads/cell, of charge storage capacity.

The capacitance of a capacitor is dependent upon the dielectric constant of the dielectric material between the electrodes of the capacitor, the distance between the electrodes, and the effective area of the electrodes. One way to retain (or even increase) the storage capacity and decrease its size is to increase the dielectric constant of the dielectric layer of the storage cell capacitor. The dielectric constant is a value which is characteristic of a material. Generally, the dielectric constant is proportional to the amount of charge that can be stored in a material when it is interposed between two electrodes. Further, generally, the dielectric constant is the ratio of the capacitance having a given dielectric material to that of the same capacitor having only a vacuum as the dielectric material.

Various high dielectric constant materials have been utilized in capacitors. For example, metal oxides such as $TiO_2$, $WO_2$, $Ta_2O_5$, BST, and $Al_2O_3$ have been used. Further, other relatively high dielectric constant materials include silicon nitride ($Si_3N_4$) and silicon dioxide/silicon nitride composite layers. As used herein, high dielectric constant materials include any materials used for capacitor dielectrics having dielectric constants of about 10 or more.

However, a major problem arises in the implementation of high dielectric constant materials for use in capacitors, such as DRAM capacitors. Generally, for example, after capacitors have been formed using conventional processes for the fabrication of a wafer including many memory devices, various other layers are formed relative to the capacitors to complete the wafer being fabricated. For example, interconnect layers are deposited, insulative materials are deposited, coatings are applied, etc. Many of such layers require the use of high temperatures (e.g., about 400° C. to about 1000° C.) relative to ambient temperature. For example, such post capacitor formation processes may include an annealing or a densification step at a relatively high temperature for a particular material which has been deposited, or further may include the alloying in a hydrogen atmosphere of a complete or almost complete wafer near the end or at the end of wafer processing. As a result of such thermal cycling, e.g., alloying in hydrogen at a relatively high temperature, high dielectric constant materials exhibit loss of oxygen or reduction of such materials during such post capacitor formation thermal cycling. Such a loss of oxygen results in electrically leaky films.

SUMMARY OF THE INVENTION

High dielectric constant materials used in capacitors exhibit a loss of oxygen or reduction of such materials during post capacitor thermal cycling resulting in undesirable effects. For example, it is believed that with the loss of oxygen in such high dielectric constant materials, a conductive path along grain boundaries of the materials is created; the conductive path being an undesirable short circuit path from electrode to electrode. As such, the capacitor exhibits a relatively high leakage current. The present invention uses materials having excess oxygen to reduce such oxygen reduction effects. Such excess oxygen materials or films act as a steady supplier of oxygen atoms during post capacitor formation thermal cycling. As such, oxygen consumed during post capacitor formation thermal cycling does not degrade the performance of the capacitors.

A method for use with the formation of a capacitor according to the present invention includes providing a capacitor structure by forming a first electrode on a portion of a substrate assembly, forming a high dielectric material over at least a portion of the first electrode, and forming a second electrode over the high dielectric material. Another layer is formed over at least a portion of the second electrode. The portion of the substrate assembly on which the first electrode is formed and/or the layer formed over the second electrode are formed of an excess oxygen containing material.

In one embodiment of the method, the excess oxygen containing material includes an ozone enhanced material deposited using an ozone enhanced chemical reaction. In another embodiment, the ozone enhanced material is a doped ozone enhanced material. Preferably, the ozone enhanced material is an ozone enhanced tetraethylorthosilicate material. The ozone enhanced tetraethylorthosilicate material may be doped ozone enhanced tetraethylorthosilicate material, such as doped with boron and phosphorous in a concentration ranging from 0 percent to about 5 percent boron and 0 percent to about 8 percent phosphorous.

In a method for use in forming a memory cell having a capacitor according to the present invention, the method includes providing a capacitor having a first electrode, a second electrode, and a high dielectric material between the first and second electrode. The capacitor is sandwiched between two regions with at least a portion of at least one of the two regions being formed of an ozone enhanced oxide material. Thereafter, one or more post capacitor formation layers during one or more thermal cycles are formed relative to the capacitor. An oxygen concentration of the high dielectric material is substantially maintained during formation of the one or more post capacitor formation layers.

A capacitor structure according to the present invention includes a first electrode formed on at least a portion of a substrate assembly, a dielectric material on at least a portion of the first electrode, a second electrode on the dielectric material, and a layer formed over at least a portion of the second electrode. The portion of the substrate assembly on which the first electrode is formed and/or the layer formed over the second electrode is an excess oxygen containing material.

DETAILED DESCRIPTION OF THE EMBODIMENTS

Figure 1:
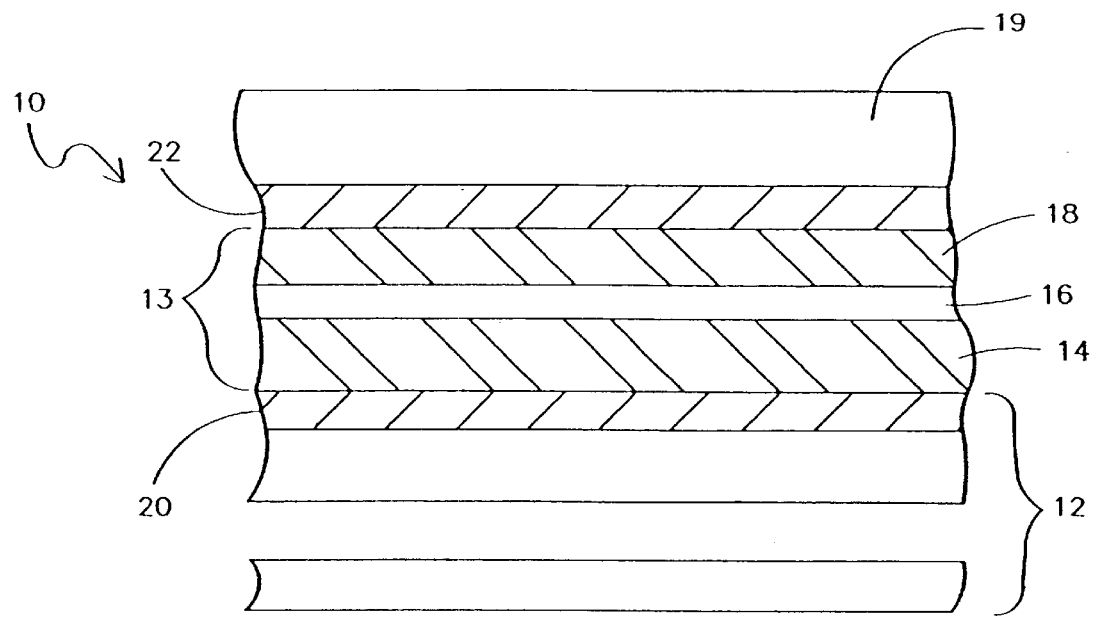
FIG. 1 is a schematic illustration of an integrated circuit structure including a capacitor in accordance with the present invention.

The present invention is directed to capacitors used in any integrated circuits, for example, in memory devices such as DRAM devices, SRAM devices, etc. As shown in FIG. 1, integrated circuit structure 10, such as a memory device structure, includes a semiconductor substrate assembly 12. Capacitor 13 is formed relative to the semiconductor substrate assembly 12.

As used in this application, "semiconductor substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously utilized to form regions/junctions in semiconductor substrates thereof. It should be apparent to one skilled in the art that scaling in the figures does not represent precise dimensions of the various elements illustrated therein.

Integrated circuit structure 10 further includes post capacitor formation layers 19. When a reference in this application is made to post capacitor formation layers, it is apparent to one skilled in the art that such post capacitor formation layers may include one or more layers, regions, structures, or any other materials formed relative to capacitor 13. Various process steps may be utilized in the formation of such post capacitor formation layers. For example, such layers may include other capacitor structures, interconnect structures, insulative layers, other wafer coatings, etc. It will be apparent to one skilled in the art that various process steps may be utilized to form such layers and that such layers may be of any shape, size, configuration, etc. In the processing of such post capacitor formation layers 19, the integrated circuit structure 10, including the capacitor 13, undergoes various thermal cycling. For example, the integrated circuit structure 10 may undergo thermal annealing to densify a BPSG layer, such post capacitor formation layers may be deposited at a high temperature relative to the formation of the capacitor 13, and, further, the integrated circuit structure 10 (e.g., a wafer including many memory devices) may undergo an alloying process in an atmosphere of hydrogen at or near the end of the wafer processing. Such thermal cycling may undesirably result in a relatively large oxygen reduction in the dielectric material of the capacitor 13.

The capacitor 13, generally includes a first electrode 14, a dielectric material or layer 16, and a second electrode 18. The two electrodes 14, 18 can be made of a wide variety of conductive materials. The electrodes may be formed of any conductive material typically used in fabricating integrated circuit capacitors. For example, such materials include metals such as titanium, copper, and aluminum, or may include doped silicon, doped polysilicon, platinum, etc. The first and second electrodes 14, 18 are typically in the form of films or plates. In some instances, the electrodes may be referred to as the storage node electrode and the cell plate capacitor electrode. It should be recognized that the terms electrode, plate, and electrode plate are used interchangeably herein. Further, in some instances, the first and second electrodes parallel one another in configuration, i.e., they take the same general shape and configuration, on opposing sides of the thin film of dielectric material.

The dielectric material 16 preferably includes a high dielectric constant material that separates the two electrodes 14, 18. Typically, the dielectric material is formed as a thin film of less than about 1,000 angstroms. According to the present invention, the dielectric material may be any oxide dielectric material, such as metal oxides (e.g., $TiO_2$, $WO_2$, $Ta_2O_5$, BST, and $Al_2O_3$). Further, the dielectric material may include a silicon dioxide/silicon nitride composite layer. Preferably, the dielectric material is a high dielectric constant material having a dielectric constant of about 10 or more.

In accordance with the present invention, the integrated circuit structure 10 includes a region 20 of the substrate assembly 12 over which lies at least a portion of the electrode 14 of capacitor 13. Further, the structure 10 further includes a layer 22 on at least a portion of the electrode 18 of capacitor 13. In accordance with the present invention, either the region 20, or the layer 22, or both is formed of any excess oxygen containing oxide material. Preferably, the layer 22 and region 20 cover as large an area of the electrode as possible. The excess oxygen containing regions or layers, such as an ozone enhanced BPSG film, act as a steady supplier of oxygen atoms during post capacitor formation thermal cycles such that the dielectric layer substantially maintains an oxygen content after such post capacitor formation which inhibits undesirable leakage.

The post capacitor formation thermal cycles utilized for processing one or more layers after the capacitor structure 13 has been formed results in a loss of oxygen or reduction of such dielectric materials. For example, one such thermal cycle includes the alloying of the completed or near completed wafer in a hydrogen atmosphere at a temperature of about 400 to about 500. Such alloying in hydrogen is a major oxygen reduction thermal cycle, capable of reducing the oxygen concentration of the dielectric and increasing the leakage current of the capacitor.

With the use of an excess oxygen containing film, such as an ozone enhanced BPSG, the excess oxygen containing films act as a steady supplier of oxygen atoms during such post capacitor formation thermal cycles. From knowledge of the amount of oxygen released during various thermal cycles, the amount of excess oxygen necessary in the ozone enhanced material when deposited to reduce leakage effects can be determined. Thus, with a predetermined concentration of excess oxygen contained in the ozone enhanced material when formed, a capacitor 13 maintaining high capacitance per unit area can be fabricated with a very low leakage current because the oxygen content is substantially maintained during the post capacitor formation processing. This prohibits conductive paths from being created from electrode to electrode in capacitor 13 and causing relatively high leakage currents (i.e., relatively high leakage currents being about $3 \times 10^{-7}$ A/cm$^2$ @ 1 volt or more).

The excess oxygen containing region 22 or layer 20 may be any material which can be formed with excess oxygen to be supplied during the formation of post capacitor formation layers 19. Preferably, the excess oxygen containing regions or layers are formed of an ozone enhanced oxide material. The ozone enhanced oxide material may be a doped ozone enhanced oxide material, such as borophosphosilicate glass (BPSG) or phosphosilicate glass (PSG). More preferably, the ozone enhanced oxide material is an ozone enhanced tetraethylorthosilicate (TEOS) material. The ozone enhanced TEOS layer may be a doped ozone enhanced TEOS material. For example, the doped TEOS may be doped with boron and phosphorous in a concentration ranging from 0 percent to about 5 percent boron and 0 percent to about 8 percent phosphorous.

In accordance with the present invention, the excess oxygen containing region 20 or layer 22, e.g., ozone enhanced oxide material, preferably has an oxygen concentration of about 66.7 percent to about 76.6 percent. In other words, an excess concentration of oxygen in the range of about 0.01 percent to about 10 percent is available for use in accordance with the present invention. The oxygen enhanced region 20 or layer 22 preferably includes enough excess oxygen such that, during formation of post capacitor formation layers 19, the oxygen concentration of the high dielectric capacitor layer 16 is substantially maintained. For example, an ozone enhanced TEOS layer would preferably include an initial oxygen concentration when formed sufficient for supplying oxygen during post capacitor formation thermal cycles to eliminate or substantially reduce the oxygen reduction in the capacitor dielectric resulting from such thermal cycling. Such post capacitor formation thermal cycles may include temperatures in the range of ambient temperature to about 1000° C.

Figure 2:
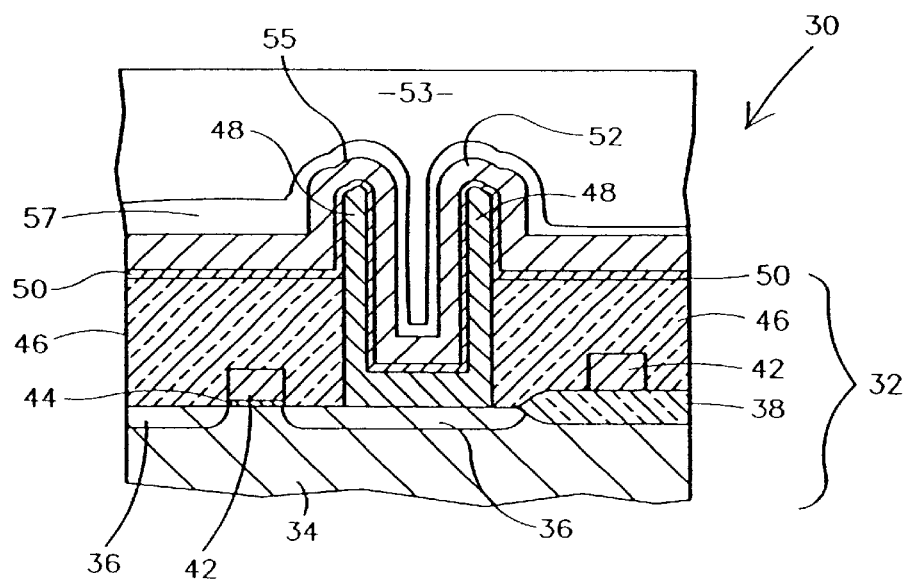
FIG. 2 is a schematic illustration of a container cell capacitor structure in accordance with the present invention.

In the method of forming capacitor 13, electrode 14 is formed relative to substrate assembly 12 as would be known to one skilled in the art depending upon the conductive material utilized for the electrode 14. For example, the electrode 14 may be a doped region of a silicon substrate as described in the illustrative capacitor structures below or the electrode 14 may be an electrode of a container capacitor structure wherein the electrode is formed relative to an oxide layer (e.g., an ozone enhanced BPSG) such as shown in FIG. 2. Thereafter, the desired dielectric material 16 is formed on at least a portion of the first electrode 14 and the second electrode is then formed on the dielectric material 16. Any suitable technique for forming the desired dielectric layers and electrodes may be used in accordance with the present invention.

The wafer including the capacitor 13 is then positioned in a reaction chamber whereupon the ozone enhanced oxide layer 22 is formed on at least a portion of the electrode 18. It should be apparent that the same process as described below for forming the layer 22 may also be used for forming the region 20 according to the present invention. One skilled in the art will recognized that there may be various other ways of achieving the excess oxygen containing oxide layer according to the present invention and is not limited to the illustrative method described below.

As described above, the excess oxygen containing material is preferably, ozone enhanced TEOS having an excess concentration of oxygen of about 0.01 percent to about 10 percent. To achieve such oxygen concentration, the ozone enhanced TEOS layer 22 is preferably deposited at a pressure in the range of about 1 torr to about 600 torr and at a temperature in the range of about 200° C. to about 600° C. by reacting TEOS with ozone (O$_3$). More particularly, a carrier gas (e.g., nitrogen), is bubbled through liquid TEOS to provide a gas mixture of controlled TEOS partial pressure in the reaction chamber. Preferably, the gas mixture of controlled TEOS partial pressure is provided to the reaction chamber at a flow rate of about 400 mg/min to about 600 mg/min. Ozone flow rate to react with the TEOS in the reaction chamber is in the range of about 2 slm to about 4 slm at a percentage weight of ozone of about 10 percent to about 15 percent. For example, a 12 percent ozone may be provided at a rate of about 3 slm for reaction with TEOS provided at a flow of 475 mg/min.

The deposition rate of the ozone enhanced TEOS layer 22 depends at least upon the TEOS partial pressure and temperature of the deposition process. Further, the oxygen concentration of the ozone enhanced TEOS layer 22 may be increased by increasing the flow of ozone into the reaction chamber or by varying the temperature of the chemical vapor deposition process. For example, with an increase in temperature, the reaction of TEOS with ozone is increased resulting in an increased amount of oxygen in the ozone enhanced TEOS layer 22. One skilled in the art will recognize that any method of depositing the oxygen rich TEOS layer or any other layer of rich in oxygen material may be used as long as the required concentration levels are attained which can serve as the supplier of oxygen during post capacitor formation thermal cycles.

As described previously, the ozone enhanced TEOS layer 22 may be a doped ozone enhanced TEOS layer. For example, such a doped ozone enhanced TEOS layer may include a certain percentage of phosphorous or boron. As known to one skilled in art, for example, the TEOS layer may be doped with boron by flowing a source of trimethylborate (TMB) to the reaction chamber during the deposition of the TEOS layer 22. As would be known to one skilled in the art, various other dopants typically utilized with TEOS or other oxides may be used.

The following description with reference to FIGS. 2–5 provides illustrative embodiments of capacitors formed in accordance with the present invention utilizing excess oxygen containing regions and layers. One skilled in the art will recognize that such description is only for illustrative purposes and that the present invention may be utilized with any integrated circuit having a capacitor. Particularly, the illustrations of FIGS. 2–5 are of portions of memory devices. However, the present invention is in no manner limited to such illustrative memory devices.

FIG. 2 depicts a cross-section of a structure 30 including a container cell capacitor on a substrate assembly 32. Container portion 48 of the capacitor connects to diffusion area 36 of the substrate assembly 32. The container portion 48 serves as the storage node electrode. Diffusion area 36 is accessed by word line 42 (separated by gate insulator 44) which in turn spans the channel's active area between diffusion areas 36. For example, the container portion 48 is polysilicon doped to the same conductivity type as underlying diffusion region 36 to ensure good ohmic contact. The substrate assembly 32 further includes an oxide 46 providing an insulating layer between underlying topography and subsequent layers and also includes field oxide region 38. The oxide 46 wherein the container portion 48 is formed, may be an ozone enhanced oxide material in accordance with the present invention. The capacitor of the structure 30 including container portion 48 further includes high dielectric material 50 formed over the container portion 48 and other structures of the substrate assembly 32. The other electrode 52, such as a conformal polysilicon layer, blankets the high dielectric material 50 and serves as a common capacitor cell electrode to an entire array of similar capacitors (not shown). The structure 30 further includes an ozone enhanced TEOS layer 57 according to the present invention. It will be recognized that an ozone enhanced TEOS layer deposited as described above exhibits excellent step coverage. Therefore, for example, the layer 57 can wrap around otherwise difficult edges, plates, etc. (e.g., edge 55 of electrode 52) and further provide dielectric oxygen loss protection. Layer 57 may replace a conventionally deposited insulator layer previously formed in other process methods for forming a memory cell or may be an additional layer formed in addition to layers formed in accordance with such conventional processes. From this point on, the wafer is completed using conventional fabrication process steps generally represented by region 53, i.e., post capacitor formation layers. Such a container capacitor structure is described in further detail in U.S. Pat. No. 5,270,241 (Dennison et al) entitled "Optimized Container Stack Capacitor DRAM Cell Utilizing Sacrificial Oxide Deposition and Chemical Mechanical Polishing."

Figure 3:
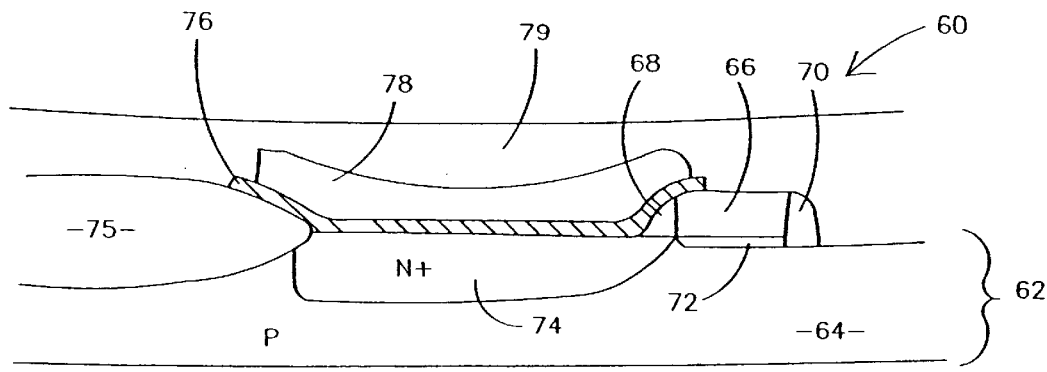
FIG. 3 is a schematic illustration of a planar cell capacitor structure in accordance with the present invention.

FIG. 3 shows a planar memory cell structure 60 which includes a high dielectric constant layer 76 formed on an n+ type silicon region 74 which serves as one electrode plate of the capacitor. As shown, the dielectric layer 76 can also be deposited on other portions of the substrate assembly 62, such as field oxide 75 and TEOS spacers 68, 70. The polysilicon region 78 forms the top electrode of the capacitor. The n+ type silicon region 74 is formed in the p type silicon substrate 64 of the substrate assembly 62. The other regions, not previously mentioned, used in forming the transistor of the structure 60 include polysilicon region 66 and gate oxide 72. The structure 60 further includes an ozone enhanced TEOS layer 79 formed according to the present invention.

Figure 4:
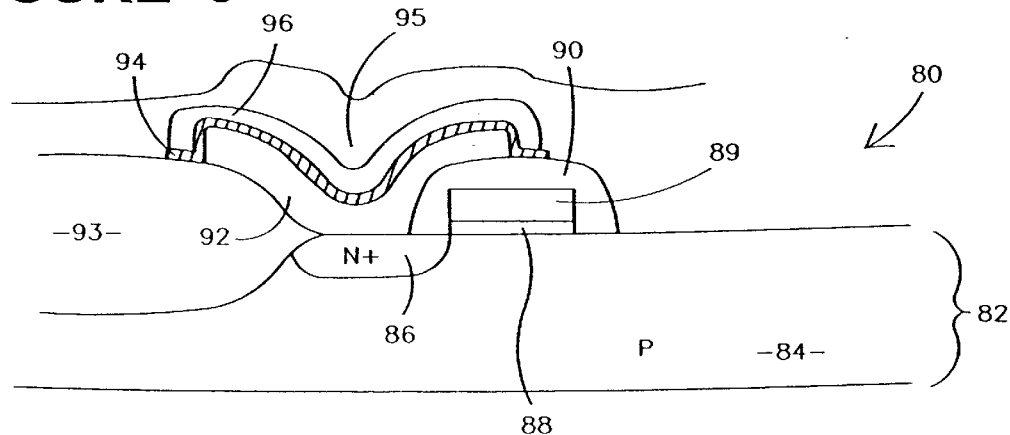
FIG. 4 is a schematic illustration of a stacked cell capacitor structure in accordance with the present invention.

A stacked capacitor cell structure 80 is shown in FIG. 4. The structure 80 includes a dielectric material 94 deposited on the polysilicon layer 92, which serves as the lower electrode of the capacitor of the memory cell. As shown, the film 94 may also be deposited on the field oxide 93 and TEOS layer 90 of the substrate assembly 82. Polysilicon region or layer 96 forms the upper electrode of the capacitor. The n+ type silicon region 86 is formed in the p type silicon substrate 84 of substrate assembly 82. The other region, not previously mentioned, used in forming the transistor of the cell includes polysilicon region 89 and gate oxide 88. The structure 80 further includes an ozone enhanced TEOS layer 95 according to the present invention formed over the electrode 96.

Figure 5:
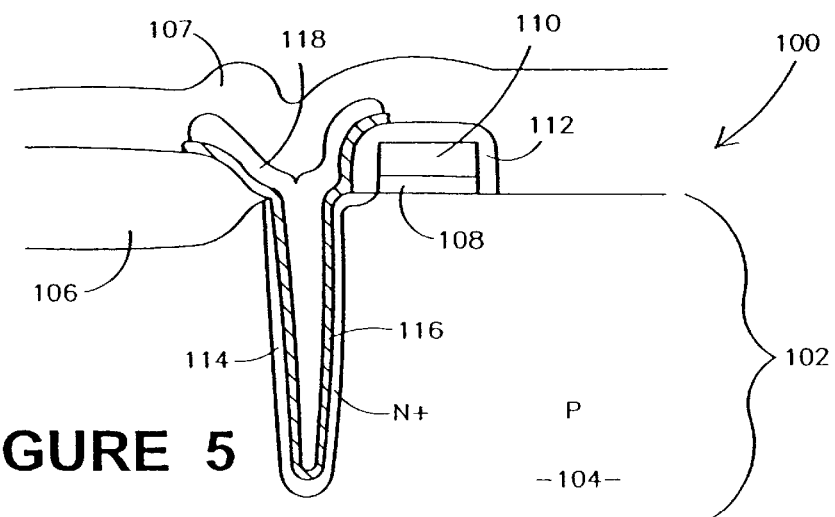
FIG. 5 is a schematic illustration of a trench cell capacitor structure in accordance with the present invention.

FIG. 5 shows a trench capacitor cell structure 100 with dielectric layer 116 deposited on n+ type silicon 114. The n+ type silicon 114 serves as the first electrode of the capacitor. As shown, the dielectric layer 116 may also be deposited on the field oxide 106 and TEOS film or region 112 of the substrate assembly 102. The n+ type silicon region 114 is formed in the p type silicon substrate 104 of the substrate assembly 102. The other regions, not previously mentioned, used in forming the transistor of the cell structure 100 include polysilicon region 110 and gate oxide 108. The structure 100 further includes an ozone enhanced TEOS layer 107 according to the present invention formed over a portion of the electrode 1 18.

As previously indicated, the above memory cell configurations or structures are for illustration only. They are not to be taken as limiting to the present invention. For example, other types of capacitor structures may include excess oxygen containing regions or layers as described herein and which may also benefit from the present invention as described herein.

All patents, patent documents, and publications cited herein are incorporated by reference as if individually incorporated. The foregoing detailed description has been given for clarity of understanding only. No unnecessary limitations are to be understood therefrom. The invention is not limited to the exact details shown and described because variations obvious to one skilled in the art will be included within the invention as defined by the accompanying claims.

What is claimed is:

1. A substrate assembly structure, comprising:
   at least a first insulating material;
   at least a first conductive material formed on at least a portion of the first insulating material;
   a dielectric material provided over at least a portion of the first conductive material;
   at least a second conductive material formed on at least a portion of the dielectric material; and
   a second insulating material formed over at least a portion of the second conductive material, wherein at least the portion of the first insulating material is formed of an excess oxygen containing material.

2. The structure of claim 1, wherein both the first insulating material and the second insulating material is formed of an excess oxygen containing material.

3. The structure of claim 1, wherein the excess oxygen containing material includes an ozone enhanced oxide material.

4. The structure of claim 3, wherein the ozone enhanced oxide material is a doped ozone enhanced oxide material.

5. The structure of claim 3, wherein the ozone enhanced oxide material is an ozone enhanced tetraethylorthosilicate material.

6. The structure of claim 5, wherein the ozone enhanced tetraethylorthosilicate material is a doped ozone enhanced tetraethylorthosilicate material.

7. The structure of claim 6, wherein the doped ozone enhanced tetraethylorthosilicate material is doped with boron and phosphorous in a concentration ranging from 0 percent to about 5 percent boron and 0 percent to about 8 percent phosphorous.

8. The structure of claim 6, wherein the ozone enhanced tetraethylorthosilicate material includes an oxygen concentration of about 66.67 percent to about 76.6 percent.

9. The structure of claim 1, wherein the substrate assembly structure comprises a wafer.

10. The structure of claim 1, wherein the substrate assembly structure comprises an integrated circuit die.

11. A substrate assembly structure, comprising:
    at least a first material;
    at least a first conductive material formed on at least a portion of the first material;

a dielectric material provided over at least a portion of the first conductive material;

at least a second conductive material formed on at least a portion of the dielectric material; and a second material formed over at least a portion of the second conductive material, wherein at least one of the portion of the first material and the second material is formed of an excess oxygen containing material, wherein the excess oxygen containing material includes a doped ozone enhanced oxide material.

12. The structure of claim 11, wherein both the first material and the second material is formed of an excess oxygen containing material.

13. The structure of claim 11, wherein the substrate assembly structure comprises a wafer.

14. The structure of claim 11, wherein the substrate assembly structure comprises an integrated circuit die.

15. A substrate assembly structure, comprising:

at least a first material;

at least a first conductive material formed on at least a portion of the first material;

a dielectric material provided over at least a portion of the first conductive material;

at least a second conductive material formed on at least a portion of the dielectric material; and a second material formed over at least a portion of the second conductive material, wherein at least one of the portion of the first material and the second material is formed of an excess oxygen containing material, wherein the excess oxygen containing material includes a doped ozone enhanced tetraethylorthosilicate material.

16. The structure of claim 15, wherein both the first material and the second material is formed of an excess oxygen containing material.

17. The structure of claim 15, wherein the doped ozone enhanced tetraethylorthosilicate material is doped with boron and phosphorous in a concentration ranging from 0 percent to about 5 percent boron and 0 percent to about 8 percent phosphorous.

18. The structure of claim 15, wherein the doped ozone enhanced tetraethylorthosilicate material includes an oxygen concentration of about 66.67 percent to about 76.6 percent.

19. The structure of claim 15, wherein the substrate assembly structure comprises a wafer.

20. The structure of claim 15, wherein the substrate assembly structure comprises an integrated circuit die.

21. A substrate assembly structure, comprising:

at least a first material;

at least a first conductive material formed on at least a portion of the first material;

a dielectric material provided over at least a portion of the first conductive material;

at least a second conductive material formed on at least a portion of the dielectric material; and a second material formed over at least a portion of the second conductive material, wherein at least one of the portion of the first material and the second material is formed of an excess oxygen containing material, wherein the excess oxygen containing material includes an oxygen concentration of about 66.67 percent to about 76.6 percent.

22. The structure of claim 21, wherein both the portion of the first material and the second material is formed of an excess oxygen containing material.

23. The structure of claim 21, wherein the excess oxygen containing material includes an ozone enhanced tetraethylorthosilicate material.

24. The structure of claim 23, wherein the ozone enhanced tetraethylorthosilicate material is a doped ozone enhanced tetraethylorthosilicate material.

25. The structure of claim 24, wherein the doped ozone enhanced tetraethylorthosilicate material is doped with boron and phosphorous in a concentration ranging from 0 percent to about 5 percent boron and 0 percent to about 8 percent phosphorous.

26. The structure of claim 21, wherein the substrate assembly structure comprises a wafer.

27. The structure of claim 21, wherein the substrate assembly structure comprises an integrated circuit die.

* * * * *